(12) United States Patent
Wuidart et al.

(10) Patent No.: US 6,780,716 B2
(45) Date of Patent: Aug. 24, 2004

(54) CHIP DIFFERENTIATION AT THE LEVEL OF A RETICLE

(75) Inventors: Luc Wuidart, Pourrieres (FR); Guilhem Bouton, Peynier (FR); Michel Bardouillet, Rousset (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/393,049

(22) Filed: Mar. 20, 2003

(65) Prior Publication Data

US 2003/0181025 A1 Sep. 25, 2003

(30) Foreign Application Priority Data

Mar. 22, 2002 (FR) ............................................. 02 03619

(51) Int. Cl.$^7$ ......................................... H01L 21/8234
(52) U.S. Cl. ........................ 438/275; 438/278; 438/290
(58) Field of Search ............................... 438/275, 278, 438/289, 290, 514

(56) References Cited

U.S. PATENT DOCUMENTS

| | | | | |
|---|---|---|---|---|
| 4,603,381 A | * | 7/1986 | Guttag | 713/190 |
| 4,933,573 A | * | 6/1990 | Takeda et al. | 327/534 |
| 5,571,739 A | * | 11/1996 | Hong | 438/275 |
| 5,576,236 A | | 11/1996 | Chang et al. | 438/278 |
| 5,604,143 A | * | 2/1997 | Ishida et al. | 438/128 |
| 6,034,889 A | * | 3/2000 | Mani et al. | 365/185.04 |
| 6,187,638 B1 | * | 2/2001 | Wen | 438/278 |
| 6,303,474 B1 | | 10/2001 | Steffen | 438/514 |
| 6,482,702 B1 | * | 11/2002 | Yu et al. | 438/278 |
| 6,623,911 B1 | * | 9/2003 | Jong et al. | 430/313 |
| 2002/0015898 A1 | * | 2/2002 | Sung et al. | 430/5 |

OTHER PUBLICATIONS

French Search Report from French Patent Application 02/03619, filed Mar. 22, 2002.

* cited by examiner

Primary Examiner—T. N. Quach
(74) Attorney, Agent, or Firm—Lisa K. Jorgenson; William R. McClellan; Wolf, Greenfield & Sacks, P.C.

(57) ABSTRACT

A method for differentiating integrated circuits implementing identical functions by storage of a binary code in a non-volatile storage element provided in each circuit, including providing, for each circuit of a same reticle, a selective implantation of dopants of its storage element which is different from the selective implantations of dopants of the storage elements of the other circuits.

10 Claims, 2 Drawing Sheets

CHIP DIFFERENTIATION AT THE LEVEL OF A RETICLE

BACKGROUND OF THE INVENTION

1. Field of the Invention

The present invention relates to the differentiation of integrated circuit chips formed in a same semiconductor wafer.

2. Discussion of the Related Art

To form integrated circuits, a large number of separate integrated circuit assemblies or chips are formed in a semiconductor wafer. From one chip to another, the circuits may be functionally identical (homogeneous) or may implement different functions (heterogeneous).

It may be desirable to differentiate circuits carrying out a same function (homogeneous). For this purpose, a chip identifier or secret quantity in the form of a binary code stored in a non-volatile memory is generally used. To make this memory inaccessible to a user, the code must be set upon manufacturing. A read-only memory is then used, formed in the same chip as the circuit thus identified. The corresponding memory cells comprise at least one MOS-type transistor. Upon circuit design, the gates of some memory cell transistors are eliminated to fix the state (on or off) of these transistors and thus program the concerned memory cells. A disadvantage is that this then modifies the physical aspect of the chip (the presence or the absence of the gates on the field insulation areas which separate the active areas of the transistors can be optically detected). The stored code can then be reconstructed based on this detection. Now, when a chip is desired to be provided with an identifier upon manufacturing, this often is because the secret of this identifier is desired to be kept.

SUMMARY OF THE INVENTION

The present invention aims at providing a method for differentiating functionally identical integrated circuits formed in a same semiconductor wafer, which overcomes the disadvantages of known methods.

The present invention more specifically aims at enabling storage of a binary code upon manufacturing, without for this code to be detectable by an optical observation of the chip.

To achieve these and other objects, the present invention provides a method for differentiating integrated circuits reproducing identical functions by storage of a binary code in a non-volatile storage element provided in each circuit, the method comprising providing, for each circuit of a same reticle, at least one selective implantation of dopants of its storage element which is different from the selective implantations of the dopants of the storage elements of the other circuits.

According to an embodiment of the present invention, a single selective dopant implantation is modified from one circuit to another within a same reticle.

According to an embodiment of the present invention, the reticle is formed by incorporating therein at least one geometry defining the storage elements, which is different from one circuit to another on the same reticle.

According to an embodiment of the present invention, the storage element is formed of elementary cells which each comprise at least one MOS transistor.

According to an embodiment of the present invention, the implantation of drain and source regions of the MOS transistors is modified from circuit to circuit.

According to an embodiment of the present invention, the implantation of the gates of the MOS transistors is modified from circuit to circuit.

According to an embodiment of the present invention, elementary cells of the storage element comprise resistors.

According to an embodiment of the present invention, the implantation of the resistors is modified from circuit to circuit.

The foregoing objects, features and advantages of the present invention will be discussed in detail in the following non-limiting description of specific embodiments in connection with the accompanying drawings.

DETAILED DESCRIPTION

For clarity, the same elements have been designated with the same references in the different drawings. Further, FIGS. 1, 2, 3, 5A, 5B, and 5C are drawn with no scale consideration. Moreover, only those steps and elements that are necessary to the understanding of the present invention have been shown and will be described hereafter. In particular, the steps of integrated circuit forming have not been detailed when conventional. Further, and for example, in FIG. 4, the read device is not shown and, in FIG. 5, not all metallizations and connections are shown.

A feature of the present invention is to store a binary code, for differentiating integrated circuit chips implementing a same function, by modifying an implantation of definition of specific regions of elementary cells of the (read-only) memory containing the code.

As will be detailed hereafter, elementary cells of ROMs comprise at least one MOS-type transistor. Drain and source regions of the transistor are defined in the semiconductor layer, by selective implantation of appropriate dopants.

Figure 1:
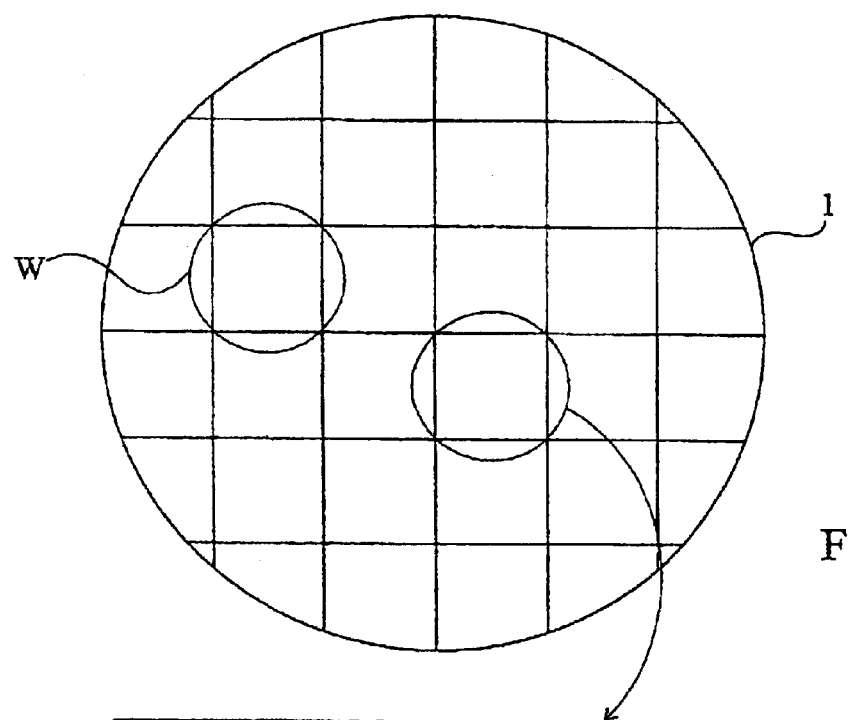
FIG. 1 shows in a partial simplified top view, a semiconductor wafer in an intermediary step of integrated circuit formation according to the present invention.

FIG. 1 illustrates, in a partial simplified top view, a semiconductor wafer 1, in an intermediary step of integrated circuit manufacturing. In this step, an implantation mask intended to define, in wafer 1, at least specific regions of elementary cells of the ROMs in which are stored circuit identification codes is formed. The masking operation comprises depositing, over the entire wafer, a resist, then submitting specific regions of the resist to an ultraviolet lighting. According to the type of resist (positive or negative), the lit—insolated—portions of the resist or not are then selectively removed to partially expose the semiconductor, for example, silicon, forming wafer 1. The resist pattern forms, at the circuit level, an implantation mask reproducing the pattern interposed, upon insolation, between the light source and wafer 1. After, and unless otherwise specified, the optically interposed element, also called the reticle, will be designated as the mask.

In practice, the insolation is performed by means of a device having a lighting window W of dimensions smaller than that of wafer 1. To give the desired pattern to the resist, wafer 1 is moved step by step vertically above exposure window W and a reticle comprising portions opaque to the radiation of the window and portions transparent thereto are interposed between said window and wafer 1. As illustrated in FIG. 1, wafer 1 is moved so that its entire surface passes at a given time under the lighting window. For clarity, a case in which the wafer is homogeneous, that is, the same reticle is used to insolate the entire wafer, is considered hereafter.

Figure 2:
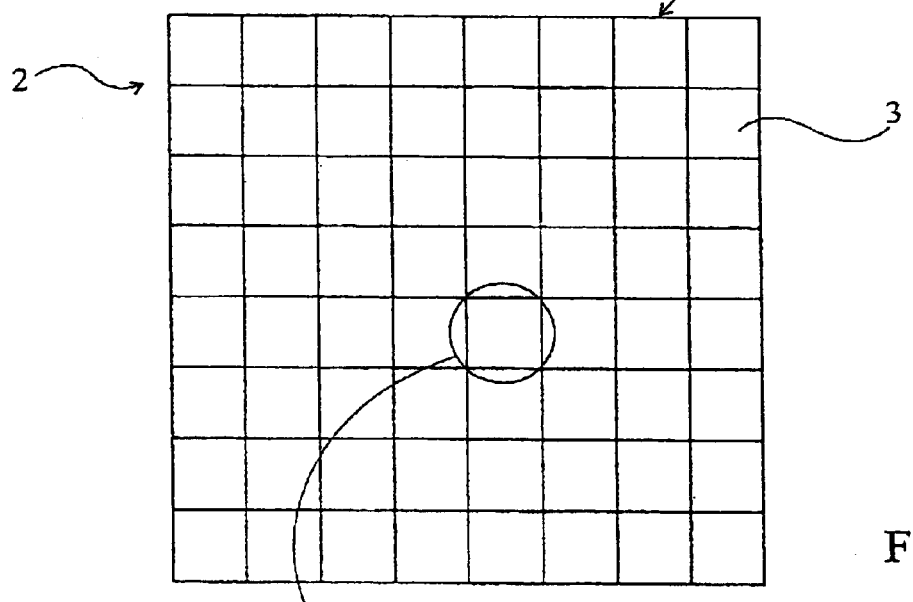
FIG. 2 is an enlarged view of a portion of FIG. 1.

FIG. 2 shows a detail of FIG. 1, that is, a reticle 2 (mask) of exposure of window W. Reticle 2 will have dimensions such that several integrated circuit chips will be simultaneously insolated. For clarity, a case in which the reticle is homogeneous, that is, the chips each comprise a same circuit, is considered hereafter. For example, reticle 2 corresponds to eight rows and eight columns, that is, 64 chips. In practice, with the increasing miniaturization of integrated circuits, a reticle may comprise several hundreds of integrated circuits.

Figure 3:
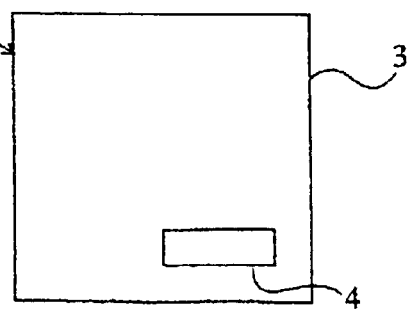
FIG. 3 is an enlarged view of a portion of FIG. 2.

FIG. 3 shows a detail of the reticle of FIG. 2, that is, one of the integrated circuits 3 that it defines. Each chip 3 comprises according to the present invention a ROM 4 intended to store a binary code of identification of the circuit being formed. Memory 4 is formed of an array of elementary cells, preferably, of a single line or column.

Figure 4:
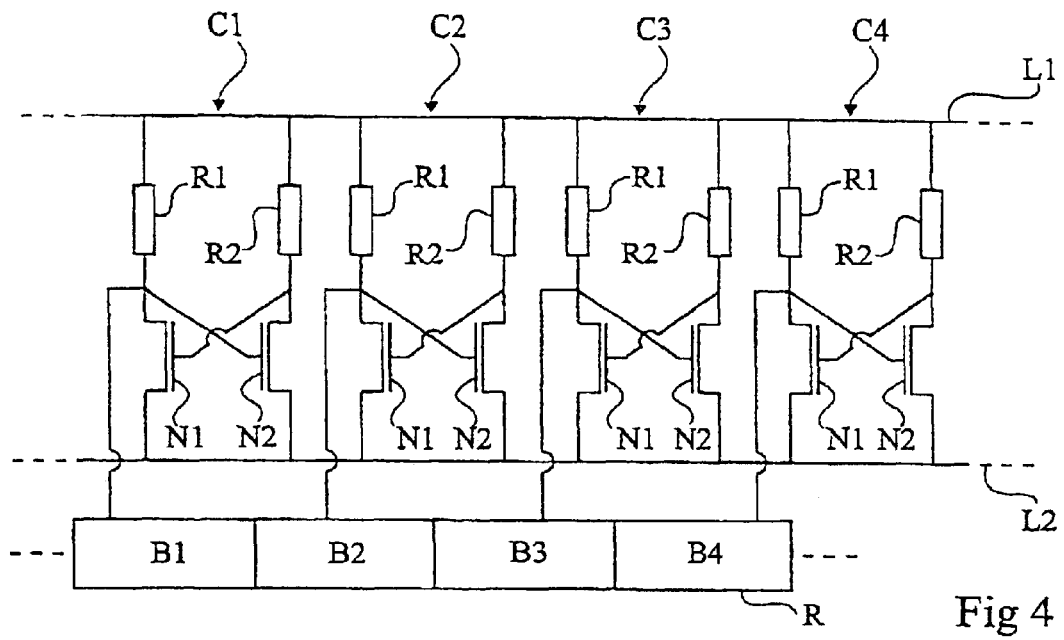
FIG. 4 is a partial simplified electric diagram of an embodiment of a circuit for storing a binary code according to the present invention.

FIG. 4 partially and schematically shows the equivalent electric diagram of a possible embodiment of a binary code storage memory according to the present invention. For simplification, FIG. 4 only shows four cells C1, C2, C3, and C4. However, according to the present invention, the number of cells in the memory is, preferably, chosen according to the number of circuits contained in the reticle to generate, with the memory bits, as many distinct codes as there are circuits on the reticle. For clarity, an embodiment of the present invention will be described hereafter in relation with a single cell C. It should however already be noted that all that will be discussed in relation with this cell also applies to the other memory cells.

In the sense of the present invention, elementary cell C may be of any known type comprising at least one MOS transistor. For example, cell C is a differential pair of two transistors N1 and N2 connected in parallel between two supply lines L1 and L2, by being each in series with a resistor R1, R2. Resistors R1 and R2 are obtained by selective implantation of dopants into silicon (polysilicon or not). It is assumed that transistors N1 and N2 are, for example, N-channel transistors. The gate of a given transistor N1, N2 is connected to the drain of the other transistor N2, N1, respectively. It is arbitrarily considered that the drain of transistor N1, common to the gate of transistor N2, forms a read terminal of binary datum B stored in cell C. According to this embodiment, the output state of cell C depends on the transistor N1 or N2 which turns on first after the application of a positive supply edge on line L1. The imbalance between the two transistors of each cell C comes from the programming specific to the present invention which will be discussed hereafter in relation with FIGS. 5A, 5B, and 5C. In the example of FIG. 4, the cell reading is performed in parallel. As an alternative, a series reading of the cells and/or a matrix with several lines and/or columns may be provided. The exploitation of a memory according to the present invention once programmed uses conventional read techniques according to the memory cell type (one or several transistors) and their arrangement.

For example, the respective cell outputs are connected to the inputs of a register R of temporary storage of the code in a reading. Register R is, preferably, reset after each reading to avoid letting the code remain outside periods when the application requires it. This goes along the line of an increased code security. Anyhow, register R is emptied upon circuit turning-off by the disappearing of the power supply (not shown).

According to another embodiment (not shown), each memory cell comprises, between lines L1 and L2, a single MOS transistor and, possibly, a resistor. The reading is then performed in series, by means of a comparator with a reference, the transistor being used as a element of selection (and programming in the absence of a resistor).

An advantage of the embodiment of FIG. 4 is that a simple state switching of a signal applied on line L1 (or L2) causes both the supply and the reading of the code stored in the memory.

According to the present invention, the programming of a cell is obtained by modifying the extent of definition implantation of the source and drain regions of its transistors N1 and N2.

Figures 5A, 5B:
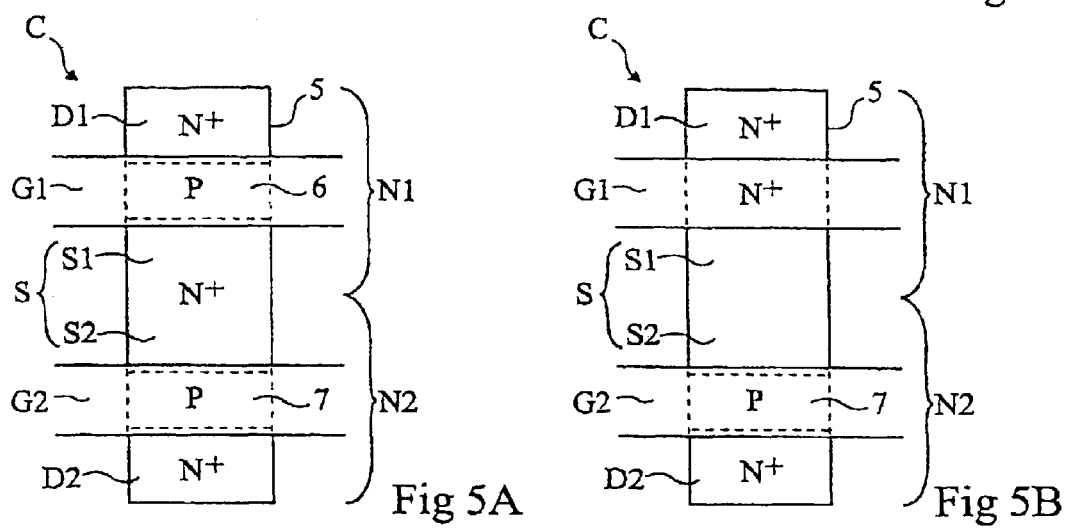
FIG. 5A partially and schematically shows an elementary cell of the circuit of FIG. 4, unprogrammed according to an embodiment of the present invention.
FIG. 5B partially and schematically shows an elementary cell of the circuit of FIG. 4, programmed in a first state according to an embodiment of the present invention.

FIG. 5A illustrates an embodiment of a cell C of FIG. 4, unprogrammed. Transistors N1 and N2 are formed side by side in a same active area 5 of wafer 1. At the manufacturing stage for which FIGS. 1, 2, and 3 have been drawn, individual drain/source regions D1 and D2 are simultaneously implanted, respectively at the top and at the bottom of FIG. 5A. At the same time, a common source/drain region S S1, S2 of transistors N1 and N2 is implanted, at the center of FIG. 5A. Wafer 1, and thus active area 5, is considered to be doped with a first conductivity type, for example, P. The dopants implanted to define drain regions D1 and D2 and source region S are of the complementary conductivity type, for example, N. Then, at a subsequent stage of the manufacturing are formed, for each transistor N1 and N2, gates G1 and G2. As illustrated in FIG. 5A, the extents of drain and source regions D1 and D2 and S are such that each gate G1 and G2 defines, in active area 5, a channel region 6, 7 separating common source S from an individual drain region D1, D2, respectively.

According to the present invention, the programming is performed by modifying the extents of implantation, for example, of the source and drain regions of a single one of transistors N1 and N2 of each cell.

FIG. 5B illustrates a mode for programming, in a cell C of FIG. 4, a datum B in a first binary state here considered as "0". FIG. 5B differs from FIG. 5A in that the extent of one of the individual drain/source regions of one of the transistors, for example, region D1 of transistor N1, is modified. For example, modified region D1 is extended so that it reaches and blends with common source region S. Then, gate G1 of transistor N1 crosses active region 5 vertically above continuous region D1-S. However, gate G2 of the other transistor N2 still defines a channel 7 in active P-type area 5. In a read access, that is, upon application of a positive supply edge on line L1, transistor N1 then turns on faster than transistor N2. Indeed, it behaves as a mere resistor and it is not necessary that a channel (6 in FIGS. 5A and 5C) be created for it, conversely to transistor N2. Transistor N1 then virtually copies on its output, that is, its drain D1, a low reference level present on line L2. Gate G2 of transistor N2 being connected to this output, the copying tends to block it in an off state which locks, at the level of its drain D2, the high level of the positive edge present on line L1. Drain D2 being connected to gate G1, the conduction imbalance is locked and cell C provides register R with a stable datum in a first binary state considered, conventionally, as "0".

Figure 5C:
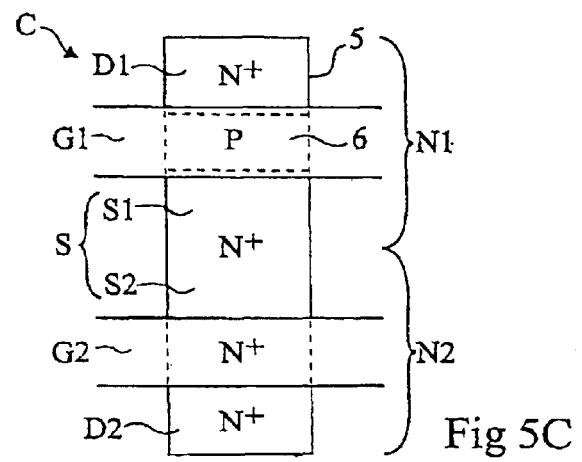
FIG. 5C partially and schematically shows an elementary cell of the circuit of FIG. 4, programmed in a second state according to an embodiment of the present invention.

FIG. 5C illustrates a mode for programming in a cell C of FIG. 4 a datum B in a second binary state considered herein as "1". FIG. 5C differs from FIG. 5A in that, with respect to FIG. 5B, the extent of the other one D2 of the individual drain/source regions of the other one N2 of the transistors of cell C is extended to reach and blend with common source region S. Then, channel 6 of transistor N1 is maintained in place while channel 7 of transistor N2 is eliminated and replaced with a strongly-conductive continuous region D2-S. In a read access, the behaviors of transistors N1 and N2 are then inverted. Drain D1 of transistor N1, that is, the output of cell C, is thus locked in a state complementary to the preceding state, here considered as "1".

By modifying as previously described in relation with FIGS. 5B and 5C the extent of the specific regions of definition of the transistors forming the elementary cell of a ROM, a storage of a binary code of as many bits as there are elementary cells is obtained, and this, in an undetectable manner. Indeed, all the formed elementary cells now comprise gates and are formed in active areas. In an optical observation, all the differentiation memory cells are thus identical, whatever their programmed state. Further, two distinct chips (with different codes) will be optically identical.

According to the present invention, in a selective dopant implantation step, at least in the memory portion of the chip, an elementary master pattern corresponding to a standard cell such as previously described in relation with FIG. 5A is reproduced. This master pattern is reproduced as many times as necessary inside of reticle 2 (FIG. 2) to enable simultaneous definition of the regions to be implanted of all chips 3 (FIGS. 2 and 3) which are necessary to be identified by means of the binary code. Then, inside of reticle 2, the extent of the various specific drain and/or source regions is modified from one cell to the other within a same chip and from one chip to the other in a distinct manner, to store in each chip a different code.

The individualization of the implantation levels is performed by simple modification of the geometries of the circuits reproduced in the reticle. In practice, computer means are used to define these masks in the form of files.

The forming of a mask is obtained by combination of layers of patterns originating from a graphical database defining the circuit. The implantation mask on which the preset invention acts is formed by incorporating, to the pattern layers defining this mask, a geometry defining the memory cell areas to be programmed.

According to the present invention, instead of reproducing a same circuit over the entire reticle (mask), the geometry defining the cell implantations is modified from circuit to circuit. As many different circuits as there are positions on the reticle are then obtained. The present invention adds, in practice, no mask level, and only requires a programming modification of an existing level.

Once the reticle has thus been formed, it is interposed between the exposure window and semiconductor wafer 1 as described previously and the entire wafer 1 is insolated step by step.

As an example, if a reticle covering 256 chips is considered, an eight-bit memory is provided to differentiate the 256 chips from one another. However, the higher the number of chips, and thus of codes, per reticle, the more the present invention is advantageous in terms of differentiation.

Of course, the present invention is likely to have various alterations, modifications, and improvement which will readily occur to those skilled in the art. In particular, a programming by conduction imbalance according to the present invention of an element of each elementary chip identifier storage cell can be performed in a great number of ways.

Thus, in the embodiment according to the present invention described in relation with FIG. 5, such a result has been considered to be obtained by modifying the expanse of an individual drain/source region of a transistor, to eliminate its channel. However, the same coding may be obtained by eliminating, that is, by not doping, the individual drain/source region of the other transistor.

Further, in the embodiment described in relation with FIG. 5 as well as in the foregoing, the programming according to the present invention comprises creating an imbalance between the resistors of access to the transistors of the programmed cells. As described in relation with FIG. 4, each transistor N1, N2 of each cell C may be associated with a respective resistor R1, R2. The storage of a binary differentiation code may be performed according to the present invention by modifying an implantation mask of resistors R1, R2.

Further, instead of modifying the conductivity by modification of the access resistance, the control conditions may be unbalanced. Indeed, in many manufacturing processes, gates G1, G2 of the transistors are doped simultaneously to increase their conductivity. According to the present invention, the implantation mask may be modified to only implant a single predetermined one of the two cell gates. The transistor having an undoped gate will then exhibit a delay upon turning on which enables storing and locking a binary datum similarly to what has been previously described.

Further, it has been considered up to now that a single implantation mask is modified. It could however be provided to modify several masks. One could for example combine an imbalance in the access resistance by modification of the expanse of a region implanted in the wafer and/or an imbalance in the access resistance by modification of the expanse of an independent resistor, and/or an imbalance in control conditions.

Those skilled in the art will readily adapt the conductivity types and the doping levels to a specific manufacturing process. In particular, the present invention has only been described by means of N-channel MOS transistors as a non-limiting example. Those skilled in the art will understand that the present invention also applies to cells using P-channel MOS transistors. The reading will then be performed by using a negative edge on line L1 (respectively a positive edge on line L2).

Similarly, those skilled in the art will readily adapt and choose the implantation masks to be modified, to obtain a binary coding, according to the structure of an elementary cell.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for differentiating integrated circuits implementing identical functions by storage of a binary code in a non-volatile storage element provided in each circuit, comprising providing, for each circuit of a reticle, at least one selective implantation of dopants of its storage element which is different from selective implantations of dopants of storage elements of other circuits of the reticle.

2. The method of claim 1, wherein a single selective dopant implantation is modified from one circuit to another within the reticle.

3. The method of claim 1, wherein the reticle is formed by incorporating therein at least one geometry defining the storage elements, which is different from one circuit to another on the reticle.

4. The method of claim 3, wherein the storage element is formed of elementary cells which each comprise resistors and wherein implantation of the resistors is modified from circuit to circuit.

5. The method of claim 1, wherein the storage element is formed of elementary cells which each comprise at least one MOS transistor having source, drain and gate regions.

6. The method of claim 5, wherein the implantation of the drain and source regions of the MOS transistors is modified from circuit to circuit.

7. The method of claim 5, wherein implantation of the gate regions of the MOS transistors is modified from circuit to circuit.

8. The method of claim 5, wherein the storage element is formed of elementary cells which each comprise resistors and wherein implantation of the resistors is modified from circuit to circuit.

9. The method of claim 1, wherein the storage element is formed of elementary cells which each comprise resistors.

10. The method of claim 9, wherein implantation of the resistors is modified from circuit to circuit.

* * * * *